United States Patent [19]

Yonehara

[11] Patent Number: 5,324,536

[45] Date of Patent: Jun. 28, 1994

[54] METHOD OF FORMING A MULTILAYERED STRUCTURE

[75] Inventor: Takao Yonehara, Atsugi, Japan

[73] Assignee: Canon Kabushiki Kaisha, Tokyo, Japan

[21] Appl. No.: 116,542

[22] Filed: Sep. 7, 1993

Related U.S. Application Data

[63] Continuation of Ser. No. 946,145, Sep. 17, 1992, abandoned, which is a continuation of Ser. No. 696,270, May 1, 1991, abandoned, which is a continuation of Ser. No. 532,232, Jun. 4, 1990, abandoned, which is a continuation of Ser. No. 251,048, Sep. 26, 1988, abandoned, which is a continuation of Ser. No. 38,767, Apr. 15, 1987, abandoned.

[30] Foreign Application Priority Data

Apr. 28, 1986 [JP] Japan ................... 61-96866

[51] Int. Cl.$^5$ ............... C23C 14/00; C23C 16/00
[52] U.S. Cl. ..................... 427/99; 427/123; 427/255.2; 427/253
[58] Field of Search .......... 427/96, 99, 123, 238, 427/241, 253, 255.2

[56] References Cited

U.S. PATENT DOCUMENTS

| | | | |
|---|---|---|---|
| 4,142,947 | 3/1979 | Cohen | 428/913 |
| 4,200,975 | 5/1980 | Debiec | 427/96 |
| 4,354,895 | 10/1982 | Ellis | 427/96 |
| 4,361,600 | 11/1982 | Brown | 427/96 |
| 4,378,383 | 3/1983 | Moritz et al. | 427/96 |
| 4,389,281 | 6/1983 | Anantha | 430/313 |
| 4,395,433 | 7/1983 | Nagakubo | 427/53.1 |
| 4,400,411 | 8/1983 | Yuan | 437/241 |
| 4,471,525 | 9/1984 | Sasaki | 357/50 |
| 4,505,027 | 3/1985 | Schwabe | 437/160 |
| 4,510,173 | 4/1985 | Higashikawa | 427/96 |
| 4,595,068 | 6/1986 | King et al. | |
| 4,597,167 | 7/1986 | Moriya et al. | |
| 4,638,335 | 1/1987 | Smith | 430/945 |
| 4,693,925 | 9/1987 | Cheung | 427/96 |
| 4,737,831 | 4/1988 | Iwai | 357/49 |
| 4,860,086 | 8/1989 | Nakamura | 357/71 |

FOREIGN PATENT DOCUMENTS 1261789 1/1972 United Kingdom .
2183090 5/1987 United Kingdom .

OTHER PUBLICATIONS

Rointan F. Bunshah, "Deposition Technologies for Films and Coatings", Noyes Publication, 1982, pp. 64–65.

Maissel, L. I. et al.: "Handbook of Thin Film Technology", McGraw-Hill Book Co., 1970, pp. 13-5 and 13-7.

Primary Examiner—Shrive Beck
Assistant Examiner—Vi Duong Dang
Attorney, Agent, or Firm—Fitzpatrick, Cella, Harper & Scinto

[57] ABSTRACT

A method of forming a multilayered structure by flattening an uneven deposited surface thereof. It comprises the steps of: forming lower and higher portions on the deposited surface with different kinds of materials; and depositing a material selectively on the lower portions alone on the surface using the difference in nucleation density between the deposited materials due to the kinds of the materials of the deposited surface, thereby flattening the surface.

6 Claims, 6 Drawing Sheets

METHOD OF FORMING A MULTILAYERED STRUCTURE

This application is a continuation of application Ser. No. 07/946,145 filed Sep. 17, 1992, now abandoned; which in turn, is a continuation of application Ser. No. 07/696,270, filed May 1, 1991, now abandoned; which in turn, is a continuation of application Ser. No. 07/532,232, filed Jun. 4, 1990, now abandoned; which in turn, is a continuation of application Ser. No. 07/251,048, filed Sep. 26, 1988, now abandoned; which in turn, is a continuation of application Ser. No. 07/038,767, filed Apr. 15, 1987, now abandoned.

BACKGROUND OF THE INVENTION

1. Field of the Invention

This invention relates to a method of forming a multilayered structure and more particularly to a surface flattening technique for forming a multilayered structure.

This invention is applicable, for example, to a multilayered structure for multilayered wiring in a semiconductor integrated circuit, an optical integrated circuit, etc.

2. Related Background Art

Rapid advances in an integrated circuit technique have more and more reduced the size of components, in connection with which the multilayering of various components and wiring has advanced. For example, two-layer Al wiring is used by memory elements of 256K bits, and such wiring will tend to be multilayered in the future.

A problem with a multilayered structure is unevenness of the surface of a device due to wiring, etc., on the respective layers. Large unevenness may cause disconnection and reduce the yield and reliability the elements. Therefore, a technique for flattening an uneven surface is essential.

One conventional flattening technique is to form a glass layer of $SiO_2$ and added phosphorus or boron an uneven surface, by CVD or coating, and flatten the resulting surface using a flow of glass due to heat. Since this method involves high-temperature processing, however, materials used for wiring, etc., are limited in kind.

Other flattening techniques have the problems that they make the steps complicated and increase the number of steps.

SUMMARY OF THE INVENTION

An object of this invention is to provide a method of forming a multilayered structure to solve the above conventional problem and to simplify the steps of the method greatly.

According to this invention, a method of forming a multilayered structure by flattening an uneven deposited surface thereof, comprising the steps of:

forming lower and higher portions on the deposited surface with different kinds of materials; and depositing a material selectively on the lower portions alone on the surface using the difference in nucleation density between the deposited materials due to the kinds of materials of the deposited surface, thereby flattening the surface.

As described above, by selective deposition of deposited materials utilizing the difference in nucleation density between the deposited materials due to the kind of materials of the deposited surface, the flattening can easily be attained without increasing the number of steps therefore, and complicating the steps. Multilayered structures of high yield and reliability can be formed by simple steps.

First, selective deposition for forming deposited films selectively on a substrate will be described. The selective deposition is to form films selectively with materials on a substrate using the differences between the materials such as surface energy, attachment coefficient, elimination coefficient, surface diffusion velocity, etc., which will influence the nucleation during the forming of thin film.

FIGS. 1A and 1B illustrate the selective deposition. First, as shown in FIG. 1A, thin films 2 of a material different in the above factors from that of the substrate is formed in desired places on a substrate 1. If an appropriate material is deposited on film 2 under appropriate depositing conditions, thin film 3 can be grown on this films 2 alone and not on other substrate portions. By using this phenomenon, thin film 3, shaped in a self-matching manner, can be grown, thereby eliminating conventional lithographic steps using a resist.

Materials for enabling such selective deposition are, for example, $SiO_2$ for substrate 1, $Si_3N_4$, metal, metal silicide or polycrystal Si, or the like, for thin film 2, and Si for thin film 3 to be deposited. As an example, the flattening by using $SiO_2$ and $Si_3N_4$ materials will now be illustrated.

FIG. 2 is a plot of nucleation densities in $SiO_2$ and $Si_3N_4$ deposited surfaces with time. As shown in this graph, soon after the start of deposition, the nucleation density on the $SiO_2$ surface is saturated below $10^3 \, cm^{-2}$ and is substantially constant even 20 minutes later.

In contrast, the nucleation density on the $Si_3N_4$ surface is saturated temporarily at a value of about $4 \times 10^5 \, cm^{-2}$ which is thereafter maintained unchanged for about 10 minutes, and then increases rapidly. It is to be noted that these measured examples are obtained by deposition using CVD process under the conditions including a pressure of 175 Torr and a temperature of 1000° C. using a $SiCl_4$ gas diluted with an $H_2$ gas.

In this case, the nucleation on $SiO_2$ hardly becomes a problem. Addition of an HCl gas to the reactive gas serves to further suppress the nucleation on $SiO_2$ to eliminate the deposition on $SiO_2$ completely.

As described above, if $SiO_2$ and $Si_3N_4$ are selected as the materials of the deposited surface and silicon is selected for a deposited material, a sufficiently large nucleation density difference can be obtained, as shown in the graph. If $Si_3N_4$ is patterned in a desired form, a polycrystal Si film can be deposited on $Si_3N_4$ alone in a self matching manner.

So long as the difference in nucleation density is $10^3$ times higher than the lower density, a deposited film can be selectively formed satisfactorily. In this case, the above materials other than $Si_3N_4$ can be used to similarly form a thin film selectively.

DETAILED DESCRIPTION OF THE PREFERRED EMBODIMENT

One embodiment of this invention will now be described in detail with reference to the drawings.

Figure 1A:
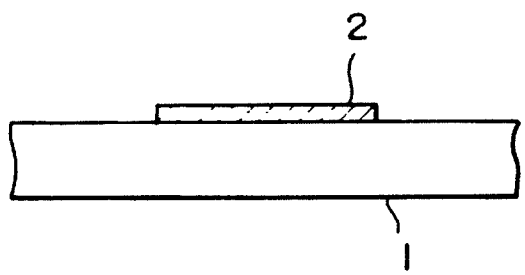
FIGS. 1A and 1B illustrate selective deposition.
Figure 1B:
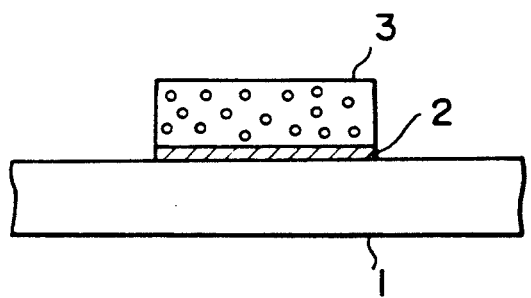
Figure 2:
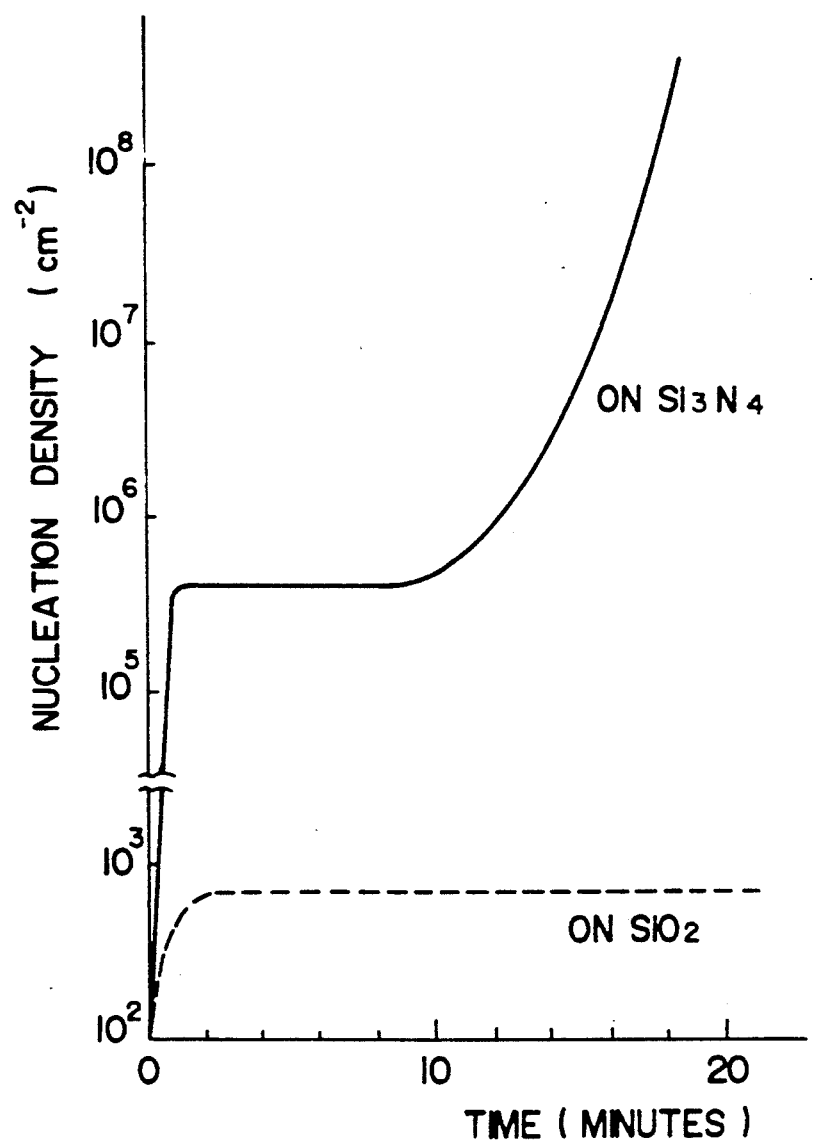
FIG. 2 is a graph of nucleation densities of $SiO_2$ and $Si_3N_4$ deposited surfaces with time.
Figure 3A:
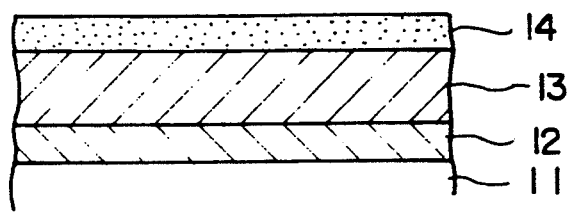
FIGS. 3A, 3B and 3C illustrate the flattening steps in one embodiment of a multilayered structure forming method according to this invention.
Figure 3B:
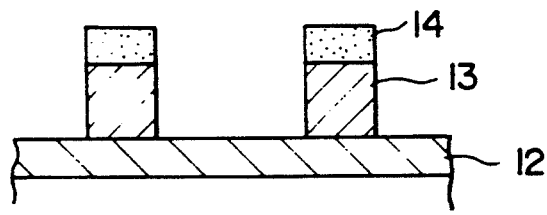
Figure 3C:
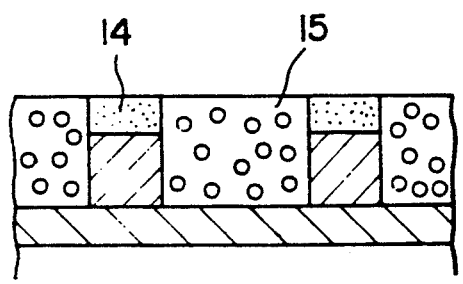
Figure 4A:
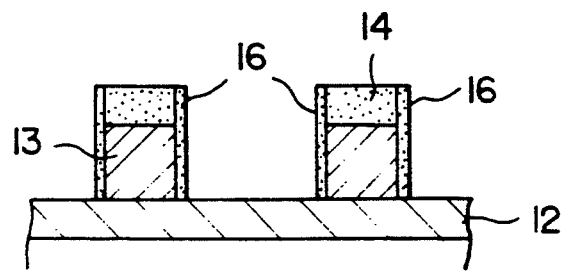
FIGS. 4A and 4B illustrate portion of the flattening steps of another embodiment of this invention.
Figure 4B:
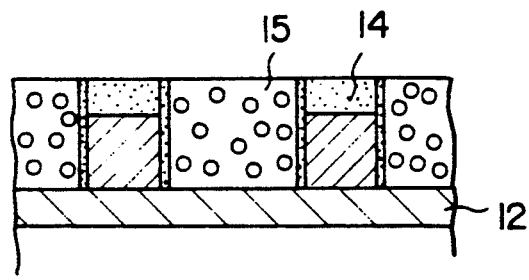

FIGS. 3A-3C illustrate the flattening steps in one embodiment of a multilayered structure forming method according to this invention. FIGS. 4A and 4B illustrate part of the flattening steps of another embodiment of this invention.

In FIG. 3A, first, a $Si_3N_4$ layer 12 is formed as an insulating layer by CVD, optical CVD or ECR (electron cyclotron resonance) on a Si substrate 11 with elements being formed thereon. Formed on the layer 12 is a wiring material 13 including a metal such as Al, W, Mo or the like, a silicide or the like including a compound of Si and a metal, for example, $WSi_2$, by CVD, sputtering, electron beam deposition or the like. Furthermore, a $SiO_2$ layer 14 is formed on the wiring material 13 by CVD or oxidation of the wiring material if same is silicide.

As shown in FIG. 3B, the wiring material 13 and $SiO_2$ layer 14 are patterned using lithography to expose $Si_3N_4$ layer 12 except at the places that the wiring pattern occupies.

As shown in FIG. 3C, a polycrystal Si layer 15 is then deposited selectively on $Si_3N_4$ layer 12 alone under the same conditions as in the above selective deposition. Polycrystal Si layer 15 is grown from the surface of $Si_3N_4$ layer 12 and not at all from $SiO_2$ layer 14. By such adjustment of the deposition time the polycrystal Si layer 15 can be deposited flush with the layer 14 to easily attain the flattening of the entire surface of the device.

The resistivity of wiring material 13 is on the order of $10^{-4}$-cm and the resistivity of polycrystal Si layer 15 to which no impurities are added is $10^3$-cm. Therefore, a current from the wiring material 13 to polycrystal Si layer 15 is negligible and the wiring material 13 can be said to be electrically insulated.

If further improved insulation is desired, as shown in FIG. 4A, $SiO_2$ can be deposited by CVD, optical CVD, ECR or the like on the patterned wiring material 13 and $SiO_2$ layer 14. $SiO_2$ layer 16 is left on the side alone of wiring material 13 by anistropic reactive ion etching (RIE). Subsequently, a polycrystal Si layer 15 is deposited under conditions similar to those in the above embodiment to attain the flattening of the surface as shown in FIG. 4B. In this case, the wiring material 13 and the high-resistance polycrystal Si layer 15 are separated by $SiO_2$ layer 16 so that further improved insulation is attained. Doped low-resistance polycrystal Si may be used for the wiring material 13.

In this case, the polycrystal Si layer 15 was deposited by CVD with good selectivity under the deposition conditions including a substrate temperature of 700° C. and a pressure of 170 Torr using $SiH_2Cl_2$ and a mixture gas of $H_2$ and HCl.

FIGS. 5A-5D illustrate the multilayering steps of one embodiment of this invention.

Figure 5A:
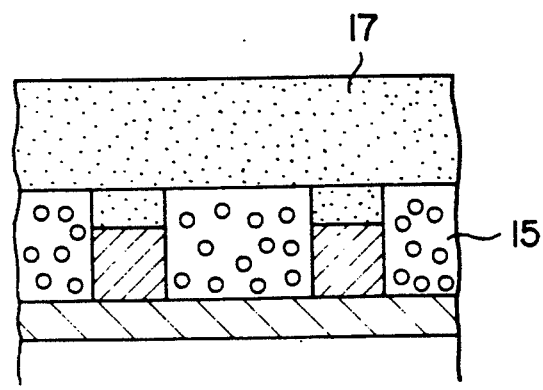
FIGS. 5A-5D illustrate the multilayering steps in one embodiment of this invention.

In FIG. 5A, a $SiO_2$ inter-layer insulating layer 17 is deposited by normal-pressure CVD on a flat surface shown in FIG. 3C. Since the underlying layer is flat, the surface of the inter-layer insulating layer 17 becomes flat automatically.

Figure 5B:
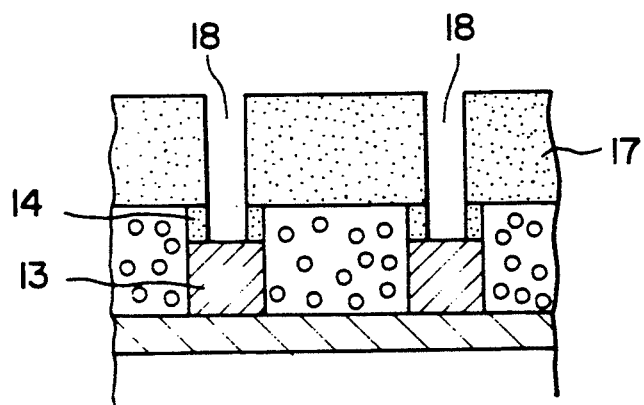

As shown in FIG. 5B, by reactive ion etching, the inter-layer insulating layer 17 and $SiO_2$ layer 14 are etched away at desired places to form contact holes 18. Thus wiring material 13 such as metal, metal silicide or polycrystal Si is exposed at the bottom of contact holes 18.

Figure 5C:
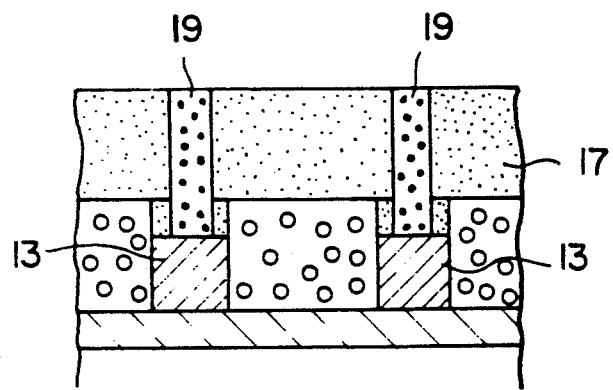
Figure 5D:
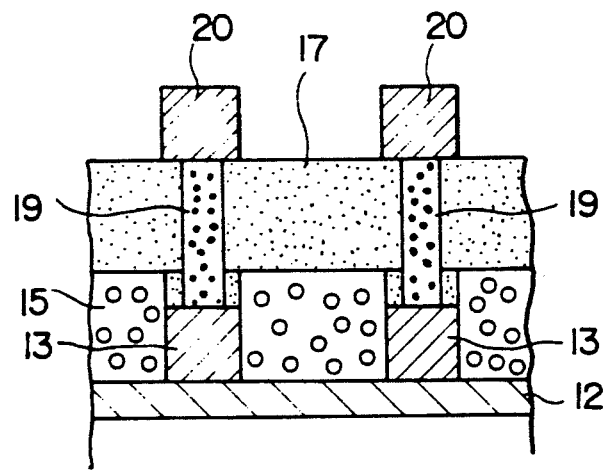

As described above, these wiring materials have sufficiently high nucleation densities compared to $SiO_2$, so that polycrystal Si layers 19 can be selectively deposited within contact holes 18 alone by CVD using a Si containing gas ($SiCl_4$, $SiH_2Cl_2$, $SiH_4$, $SiHCl_3$) (FIG. 5C).

It is to be noted that in order to lower the resistance of polycrystal Si layer 19, during deposition, a $PH_3$ gas is mixed in, phosphorus or boron is ion injected, or phosphorus glass of $POCl_3$ and oxygen is deposited, as is usually performed in the prior art. This results in a sheet resistance of tens of ohms/□.

A wiring material 20 is then deposited on inter-layer insulating layer 17 and polycrystal Si layer 19 and patterned to form second-layer wiring having inter-layer connections. In that case, by depositing polycrystal Si layers 19 within contact holes 18 so as to be flush with inter-layer insulating layer 17, a wiring material 20 can be formed on a flat surface to thereby obtain an ideal multilayered wiring structure.

Furthermore, by repeating the flattening steps shown in FIGS. 3 and 4, and the multilayering steps shown in FIG. 5, a multilayered wiring structure can easily be formed.

By such selective deposition, recesses in the wiring material 13, contact holes 18, etc., can selectively be filled to thereby attain the flattening of the surface easily.

While in the above embodiment, the multilayered wiring structures have been described and shown, this invention is not limited to them. This invention may be applicable to layering on an uneven surface due to provision of various elements and wiring therefor.

As described above in detail, a multilayered structure forming method according to these embodiments uses selective deposition which includes the step of depositing deposited materials selectively on a surface using the difference in nucleation density between the deposited materials depending on the kind of material of the deposited surface to easily attain the flattening of the surface without increasing the number of steps and complicating the steps. Therefore, a multilayered structure can easily be formed which is free from disconnection and of high yield and reliability.

I claim:

1. A method for producing a flattened multilayered structure from a structure having an uneven surface comprising the steps of:

forming a first layer comprised of an insulated silicon nitride;

forming a second layer having a surface over said first layer such that said first layer is exposed through an opening in said second layer, said second layer being comprised of silicon oxide which has a smaller nucleation density than the silicon nitride; and selectively depositing a polycrystal silicon in said opening in said second layer and on the exposed portion of said first layer by using the difference in the nucleation density between said first and second layers to thereby form a flattened surface coextensive with the surface of said second layer.

2. A method for producing a flattened multilayered structure from a structure having an uneven surface comprising the steps of:

forming a first layer comprised of a metal;

forming a second layer having a surface over said first layer such that said first layer is exposed through an opening in said second layer, said second layer being comprised of silicon oxide which has a smaller nucleation density than the metal; and selectively depositing a polycrystal silicon in said opening in said second layer and on the exposed portion of said first layer by using the difference in nucleation density between said first and second layers to thereby form a flattened surface coextensive with the surface of said second layer.

3. A method for producing a flattened multilayered structure from a structure having an uneven surface comprising the steps of:

forming a first layer comprised of a metal silicide;

forming a second layer having a surface over said first layer such that said first layer is exposed through an opening in said second layer, said second layer being comprised of silicon oxide which has a smaller nucleation density than the metal silicide; and selectively depositing a polycrystal silicon in said opening in said second layer and on the exposed portion of said first layer by using the difference in nucleation density between said first and second layers to thereby form a flattened surface coextensive with the surface of said second layer.

4. A method according to claim 1, wherein a wiring material is provided between said first and second layers.

5. A method according to claim 4, wherein said wiring material is selected from the group consisting of a metal, a metal silicide, and a polycrystalline silicon.

6. A method according to claim 5, wherein said metal is selected from the group consisting of Al, W and Mo.

* * * * *

UNITED STATES PATENT AND TRADEMARK OFFICE
CERTIFICATE OF CORRECTION

PATENT NO. : 5,324,536
DATED : June 28, 1994
INVENTOR(S) : TAKAO YONEHARA

It is certified that error appears in the above-identified patent and that said Letters Patent is hereby corrected as shown below:

COLUMN 1

Line 37, "reliability" should read --the reliability of--.
  Line 41, "an" should read --on an--.

COLUMN 2

Line 3, "therefore," should read --therefor,--.
  Line 13, "film." should read --films.--.
  Line 15, "films 2" should read --film 2--.
  Line 19, "this" should read --thin--.
  Line 20, "films 2" should read --film 2--.
  Line 53, "self matching" should read --self-matching--.

COLUMN 3

Line 1, "FIGS. 5A-5D" should read --FIGS. 5A, 5B, 5C and 5D--.

Signed and Sealed this

Twenty-second Day of November, 1994

Attest:

BRUCE LEHMAN

*Attesting Officer*      *Commissioner of Patents and Trademarks*